(12) United States Patent
Hatano et al.

(10) Patent No.: US 9,443,912 B2
(45) Date of Patent: Sep. 13, 2016

(54) SOLID-STATE IMAGE PICKUP DEVICE AND MANUFACTURING METHOD THEREOF

(71) Applicant: Sony Corporation, Tokyo (JP)

(72) Inventors: Keisuke Hatano, Kanagawa (JP);
Tetsuji Yamaguchi, Kanagawa (JP);
Shintarou Hirata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/362,422

(22) PCT Filed: Nov. 30, 2012

(86) PCT No.: PCT/JP2012/081082
§ 371 (c)(1),
(2) Date: Jun. 3, 2014

(87) PCT Pub. No.: WO2013/088975
PCT Pub. Date: Jun. 20, 2013

(65) Prior Publication Data
US 2015/0041781 A1    Feb. 12, 2015

(30) Foreign Application Priority Data
Dec. 12, 2011 (JP) .................. 2011-271195

(51) Int. Cl.
H01L 27/00    (2006.01)
H01L 27/30    (2006.01)
H01L 51/44    (2006.01)
H01L 51/42    (2006.01)
H01L 51/00    (2006.01)

(52) U.S. Cl.
CPC ......... *H01L 27/307* (2013.01); *H01L 51/0001* (2013.01); *H01L 51/42* (2013.01); *H01L 51/441* (2013.01); *H01L 51/447* (2013.01); *H01L 51/448* (2013.01)

(58) Field of Classification Search
CPC ... H01L 27/307; H01L 51/42; H01L 51/448; H01L 51/441
See application file for complete search history.

(56) References Cited

U.S. PATENT DOCUMENTS

| | | | |
|---|---|---|---|
| 2009/0065888 A1* | 3/2009 | Kato et al. ..................... | 257/476 |
| 2010/0309357 A1* | 12/2010 | Oike ................. | H01L 27/14609 348/302 |
| 2011/0032376 A1* | 2/2011 | Takizawa .......... | H01L 27/14627 348/222.1 |
| 2011/0074283 A1* | 3/2011 | An et al. ....................... | 313/533 |
| 2011/0127631 A1* | 6/2011 | Kawashima ...... | H01L 27/14603 257/466 |
| 2012/0025059 A1* | 2/2012 | Kawashima ...... | H01L 27/14623 250/208.1 |
| 2013/0033628 A1* | 2/2013 | Yamaguchi ....... | H01L 27/14632 348/294 |
| 2013/0093911 A1* | 4/2013 | Sul ........................ | H01L 27/307 348/222.1 |
| 2014/0231782 A1* | 8/2014 | Imai ...................... | H01L 51/448 257/40 |

FOREIGN PATENT DOCUMENTS

| | | |
|---|---|---|
| JP | 2002-353307 | 12/2002 |
| JP | 2004-296904 | 10/2004 |
| JP | 2006-245045 | 9/2006 |
| JP | 2006-261613 | 9/2006 |
| JP | 2010-109137 | 5/2010 |
| JP | 2010-141020 | 6/2010 |
| JP | 2011-138927 | 7/2011 |
| JP | 2011-233746 | 11/2011 |
| WO | WO 2008/126268 A1 | 10/2008 |

* cited by examiner

*Primary Examiner* — Ngan Ngo
(74) *Attorney, Agent, or Firm* — Sheridan Ross P.C.

(57) ABSTRACT

There is provided a solid-state image pickup device that includes a functional region provided with an organic film, and a guard ring surrounding the functional region.

19 Claims, 10 Drawing Sheets

SOLID-STATE IMAGE PICKUP DEVICE AND MANUFACTURING METHOD THEREOF

TECHNICAL FIELD

The present disclosure relates to a solid-state image pickup device that uses an organic film as a photoelectric conversion film, and a method of manufacturing such a solid-state image pickup device.

BACKGROUND ART

A solid-state image pickup device has been proposed that interposes a photoelectric conversion film which is configured of an organic film between a transparent pixel electrode and a transparent counter electrode. On the transparent counter electrode, a protective layer that is configured of an inorganic material is provided to block off moisture, gas, and the like (for example, see Japanese Unexamined Patent Application Publication No. 2006-245045 (PTL 1)).

CITATION LIST

Patent Literature

PTL 1: Japanese Unexamined Patent Application Publication No. 2006-245045

SUMMARY OF THE INVENTION

The protective layer described in the PTL 1 is capable of suppressing intrusion of moisture and gas (especially, oxygen) from a top surface of a solid-state image pickup device. However, in the event of intrusion of moisture and gas from a transverse direction, such as end surfaces that are formed at the time of chip dicing, and side surfaces of an aperture for exposing a bonding pad, it may be difficult to prevent such an intrusion by the use of the protective layer described in the PTL 1, and thus this has caused a disadvantage of deterioration in the characteristics of a photoelectric conversion film that is configured of an organic film.

Accordingly, it is desirable to provide a solid-state image pickup device capable of suppressing intrusion of moisture and gas from a transverse direction, such as end surfaces of a chip, and side surfaces of an aperture on a bonding pad, as well as a method of manufacturing such a solid-state image pickup device.

A solid-state image pickup device according to an embodiment of the present disclosure includes a functional region provided with an organic film, and a guard ring surrounding the functional region.

In the solid-state image pickup device according to an embodiment of the present disclosure, the functional region having the organic film is surrounded by the guard ring. Therefore, moisture and gas that may intrude from a transverse direction, such as end surfaces of a chip, and side surfaces of an aperture on a bonding pad are blocked off by the guard ring.

A first method of manufacturing a solid-state image pickup device according to an embodiment of the present disclosure includes the following steps (A) to (C).
(A) Forming a functional region provided with an organic film on a principal surface side of a semiconductor substrate, and (B) Forming a guard ring surrounding the functional region by laminating one or more metallic layers around the functional region.

A second method of manufacturing a solid-state image pickup device according to an embodiment of the present disclosure includes the following steps (A) to (C).
(A) Forming a functional region provided with an organic film on a principal surface side of a semiconductor substrate, and forming an insulating film around the functional region, and
(B) Forming a guard ring surrounding the functional region by providing a groove on the insulating film to form an embedded layer that is configured of a metallic film or a silicon nitride film inside the groove.

A third method of manufacturing a solid-state image pickup device according to an embodiment of the present disclosure includes the following steps (A) and (B).
(A) Forming a functional region provided with an organic film on a principal surface side of a semiconductor substrate, and forming an insulating film around the functional region, and
(B) Forming a guard ring surrounding the functional region by providing a groove on the insulating film to clad a passivation film inside the groove.

According to the solid-state image pickup device of an embodiment of the present disclosure, the functional region having the organic film is surrounded by the guard ring. Therefore, it is possible to suppress intrusion of moisture and gas from a transverse direction, such as end surfaces of a chip, and side surfaces of an aperture on a bonding pad.

According to the first method of manufacturing a solid-state image pickup device of an embodiment of the present disclosure, the guard ring surrounding the functional region is formed by laminating one or more metallic layers around the functional region. According to the second method of manufacturing a solid-state image pickup device of an embodiment of the present disclosure, the guard ring surrounding the functional region is formed by providing a groove on the insulating film around the functional region to form an embedded layer that is configured of a metallic film or a silicon nitride film inside the groove. According to the third method of manufacturing a solid-state image pickup device of an embodiment of the present disclosure, the guard ring surrounding the functional region is formed by providing a groove on the insulating film around the functional region to clad a passivation film inside the groove. Therefore, it is possible to easily manufacture the above-described solid-state image pickup device according to an embodiment of the present disclosure.

MODES FOR CARRYING OUT THE INVENTION

Figure 1:
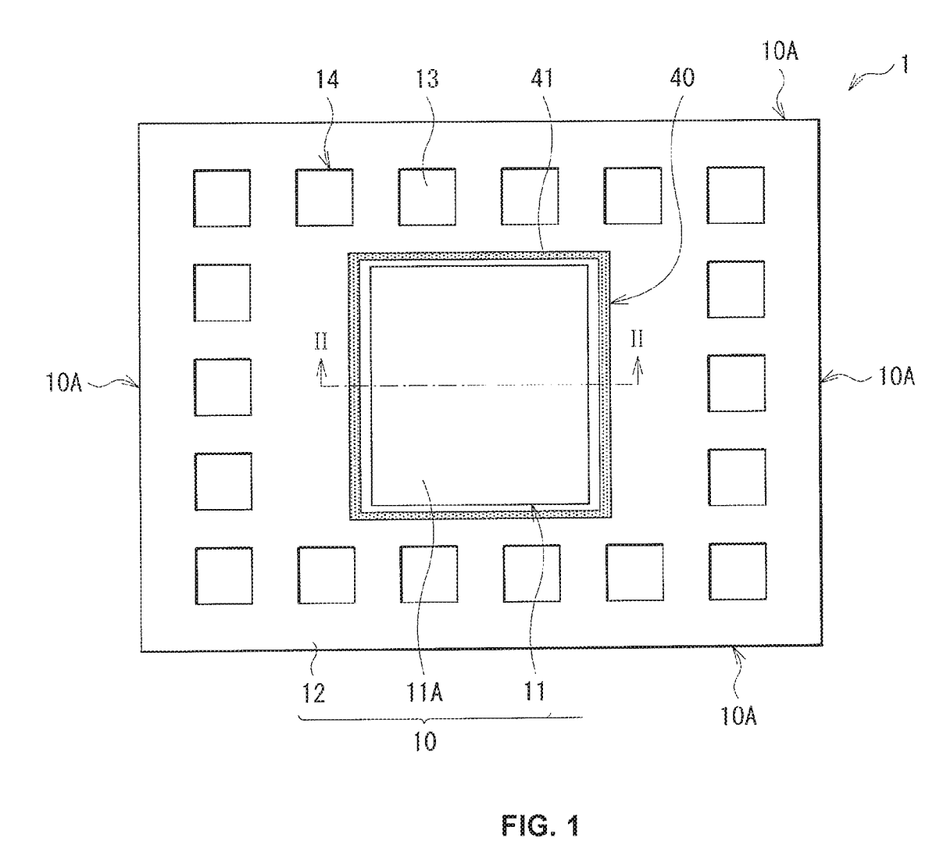
FIG. 1 is a schematic plan view showing a configuration of a solid-state image pickup device according to a first embodiment of the present disclosure.
Figure 2:
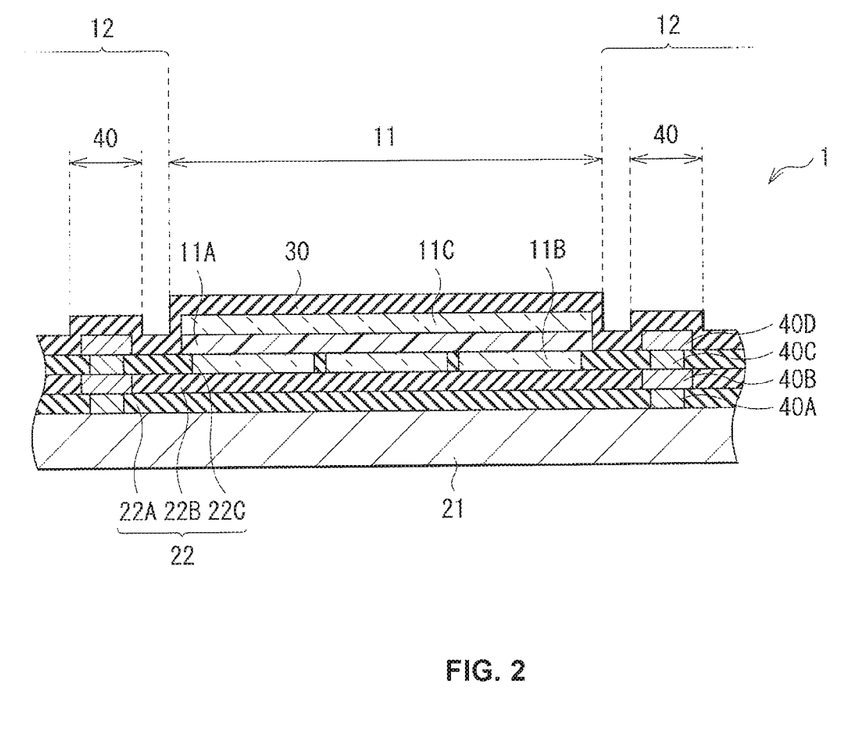
FIG. 2 is a cross-sectional view in II-II line of the solid-state image pickup device illustrated in FIG. 1.

Hereinafter, some embodiments of the present disclosure are described in details with reference to the drawings. It is to be noted that the descriptions are provided in the order given below.
1. First Embodiment (an example where a first guard ring is provided at a region that surrounds a functional region and that does not include an aperture, and an example where a guard ring is formed by laminating one or more metallic layers around a functional region)
2. Second Embodiment (an example where a guard ring is formed by providing a groove on an insulating film around a functional region to form an embedded layer that is configured of a metallic film or a silicon nitride film inside the groove)
3. Third Embodiment (an example where a guard ring is formed by providing a groove on an insulating film around a functional region to clad a passivation film inside the groove)
4. Fourth Embodiment (an example where a second guard ring surrounding an aperture and a third guard ring along an outer circumference of a chip are provided)
5. Fifth Embodiment (an example where all of first guard ring, second guard ring, and third guard ring are used in combination)
6. Sixth Embodiment (an example where a second guard ring is provided across a plurality of apertures)
7. Seventh Embodiment (an example of a connecting configuration between a lower transparent electrode and a bonding pad)
8. Modification Examples 1. First Embodiment FIG. 1 shows a planar configuration of a chip that is a solid-state image pickup device according to a first embodiment of the present disclosure. FIG. 2 shows an example of a cross-sectional configuration in II-II line of the solid-state image pickup device illustrated in FIG. 1. This solid-state image pickup device 1 is used in an electronic apparatus such as a camera, and has a functional region (photoelectric conversion region) 11 that performs a photoelectric conversion at the center of a rectangular chip 10. At the functional region 11, an organic film 11A that is a photoelectric conversion film is provided, and a plurality of pixels each of which is configured of a solid-state image pickup element having this organic film 11A are arranged in a matrix pattern. In a peripheral region 12 around the functional region 11, a plurality of bonding pads 13 are arranged in a manner of surrounding the functional region 11. On each of these bonding pads 13, there is provided an aperture 14.

The organic film 11A is configured of an organic photoelectric conversion film. The organic photoelectric conversion film that performs a photoelectric conversion with green wavelength light may be configured of an organic photoelectric conversion material including, for example, rhodamine-based pigment, melacyanine-based pigment, quinacridone, and the like. The organic photoelectric conversion film that performs a photoelectric conversion with red wavelength light may be configured of an organic photoelectric conversion material including, for example, phthalocyanine-based pigment. The organic photoelectric conversion film that performs a photoelectric conversion with blue wavelength light may be configured of an organic photoelectric conversion material including, for example, coumarine-based pigment, tris-8-hydroxyquinoline aluminum ($Alq_3$), melacyanine-based pigment, and the like.

The organic film 11A is interposed between a lower transparent electrode (pixel electrode) 11B and an upper transparent electrode (counter electrode) 11C. The lower transparent electrode 11B is split with respect to each of the plurality of pixels inside the functional region 11. FIG. 2 shows the lower transparent electrode 11B corresponding to three pixels. However, as a matter of course, it is possible to set up the number of pixels arbitrarily as appropriate. The lower transparent electrode 11B is connected with the bonding pad 13 via wiring that is not shown in the drawing. This connection between the lower transparent electrode 11B and the bonding pad 13 is described by taking an example in the seventh embodiment. The upper transparent electrode 11C is a common electrode for all of the plurality of pixels inside the functional region 11. Each of the lower transparent electrode 11B and the upper transparent electrode 11C may be configured of a transparent conductive material such as ITO (Indium Tin Oxide).

The functional region 11 is provided on the side of a principal surface (light incidence surface) of a semiconductor substrate 21 such as a silicon (Si) substrate. In a surrounding area (lateral side and lower side) of the functional region 11, there are provided insulating films 22A, 22B, and 22C (hereinafter collectively called an insulating film 22) each of which is configured of a silicon oxide ($SiO_2$) film.

A top surface of the chip 10, more specifically, a top surface of the functional region 11 and a top surface of the insulating film 22 are covered by a passivation film 30 over a whole area thereof. The passivation film 30 has a function as a protective film for preventing moisture and gas from intruding into the functional region 11 from the top surface of the chip 10, and may be desirably configured of a material film that is not permeable to moisture and oxygen. In concrete terms, the passivation film 30 may be desirably configured of a silicon nitride film, a silicon oxynitride film, or an aluminum oxide film. Alternatively, the passivation film 30 may be desirably configured of a laminated film stacking the silicon nitride film, the silicon oxynitride film, or the aluminum oxide film.

On the other hand, four end surfaces 10A of the chip 10 are formed by dicing (cutting), and cutting surfaces of the insulating film 22 and the like are exposed thereon. Also, on side surfaces of the aperture 14 illustrated in FIG. 1 as well, cutting surfaces of the insulating film 22 and the like are exposed.

Accordingly, this solid-state image pickup device 1 has a guard ring 40 surrounding the functional region 11. More specifically, this guard ring 40 is configured of a material film that is not permeable to moisture and oxygen. As a result, in this solid-state image pickup device 1, it is possible to block off any intrusion path of moisture and gas from a transverse direction, such as the end surfaces 10A of the chip 10, and side surfaces of the aperture 14 on the bonding pad 13, and to prevent moisture and gas from intruding into the functional region 11.

As a planar shape of the guard ring 40, it may be desirable to include a first guard ring 41 that is provided at a region that surrounds the functional region 11 and that does not include the aperture 14. In other words, the first guard ring 41 may be desirably arranged at an outer side from the functional region 11 and at an inner side from the aperture 14. This is because when the aperture 14 is placed within a region surrounded by the first guard ring 41, an intrusion path of moisture and gas may be formed that reaches the functional region 11 from the side surfaces of the aperture 14. More specifically, as shown in FIG. 1, the first guard ring 41 is arranged with the aperture 14 excluded along a visible outline of the functional region 11. It is to be noted that a planar shape of the guard ring 40 is not limited to a rectangle illustrated in FIG. 1, and may have various forms in accordance with shapes and arrangements of the functional region 11 and the aperture 14. Possible examples of a planar shape of the guard ring 40 may include a polygon, a circle, an ellipse, a shape including curves, such as a rectangle with rounded corners, and other indefinite shapes.

As a cross-sectional configuration of the guard ring 40, it may be desirable to have a configuration in which one or more metallic layers are laminated around the functional region 11 on the principal surface side of the semiconductor substrate 21. More specifically, for example, as shown in FIG. 2, the guard ring 40 may have a configuration of vertically stacking four-layer metallic layers including a first metallic plug 40A, a first metallic wire 40B, a second metallic plug 40C, and a second metallic wire 40D in this order from the semiconductor substrate 21. It is possible to form these metallic layers by utilizing existing metallic wiring layers that are originally provided on the solid-state image pickup device 1, such as plugs (not shown in the drawing) for making a connection between the lower transparent electrode 11B and the semiconductor substrate 21, and wires (not shown in the drawing) for applying voltages to the lower transparent electrode 11B and the upper transparent electrode 11C, and by using the same processes on the same layers as with these existing metallic wiring layers.

Each of the metallic layers configuring the guard ring 40 may be desirably configured of, for example, aluminum, tungsten, titanium, molybdenum, tantalum, copper, an alloy film of aluminum, tungsten, titanium, molybdenum, tantalum, copper, or a silicon- or oxygen-containing metallic film of aluminum, tungsten, titanium, molybdenum, tantalum, and copper. Examples of the above-described silicon-containing metallic film may include silicon-containing aluminum (AlSi), tungsten silicide (WSix), and titanium silicide (TiSix). An example of the above-described oxygen-containing metallic film may include an aluminum oxide ($Al_2O_3$) film.

The lowermost metallic layer configuring the guard ring 40 (that is, the first metallic plug 40A in FIG. 2) may be desirably connected with the semiconductor substrate 21. This is because it is possible to assuredly block off intrusion of moisture and the like.

The passivation film 30 may be desirably cladded directly just above the uppermost metallic layer configuring the guard ring 40 (that is, the second metallic wire 40D in FIG. 2). This is because when a silicon oxide film such as the insulating film 22 is interposed between the passivation film 30 and the guard ring 40, an intrusion path of moisture and the like may be formed through such a silicon oxide film.

It is to be noted that if the guard ring 40 is configured of at least one layer on the same layer as the organic film 11A (just beside the organic film 11A), it is possible to prevent moisture and gas from intruding into the organic film 11A. However, as described above, the guard ring 40 may desirably have a configuration of laminating one or more metallic layers. The silicon oxide film configuring the insulating film 22 is apt to permeate moisture and the like therethrough, and thus a laminated structure of the guard ring 40 allows propagation of moisture and the like through the insulating film 22 to be suppressed assuredly. Further, a laminated structure of the guard ring 40 makes it possible to reduce unevenness or level difference on the top surface of the chip 10, and it is possible to facilitate subsequent manufacturing processes (formation of a planarizing film, as well as formation of a color filter and an on-chip lens).

It is possible to manufacture this solid-state image pickup device 1 in the following manner, for example.

First, the insulating film 22A that is made of the above-described material is formed on the semiconductor substrate 21. An aperture is provided on the insulating film 22A, and the first metallic plug 40A corresponding to a lowermost layer of the guard ring 40 is formed inside this aperture. At the same time, if desired, a metallic plug or a metallic wire that is not shown in the drawing may be formed.

Next, the insulating film 22B that is made of the above-described material is formed on the insulating film 22A. An aperture is provided on the insulating film 22B, and the first metallic wire 40B corresponding to a second layer of the guard ring 40 is stacked on the first metallic plug 40A. At the same time, if desired, a metallic plug or a metallic wire that is not shown in the drawing may be formed.

Subsequently, the lower transparent electrode 11B that is made of the above-described material is formed on the insulating film 22B. Thereafter, the insulating film 22C that is made of the above-described material is formed at a clearance and a surrounding area of the lower transparent electrode 11B. An aperture is provided on the insulating film 22C, and the second metallic plug 40C corresponding to a third layer of the guard ring 40 is stacked on the first metallic wire 40B. At the same time, if desired, a metallic plug or a metallic wire that is not shown in the drawing may be formed.

Thereafter, the organic film 11A and the upper transparent electrode 11C are formed on the lower transparent electrode 11B. In such a manner, the functional region 11 having the lower transparent electrode 11B and the upper transparent electrode 11C with the organic film 11A interposed between is formed.

Further, the second metallic wire 40D corresponding to an uppermost layer of the guard ring 40 is stacked on the second metallic plug 40C. In such a manner, the guard ring 40 that stacks the four-layer metallic layers is formed around the functional region 11. At the same time, if desired, a metallic plug or a metallic wire that is not shown in the drawing may be formed.

Afterward, the passivation film 30 that is made of the above-described material is formed over a whole area of the top surface of the functional region 11 and the top surface of the insulating film 22. At this time, the passivation film 30 may be desirably cladded directly just above the uppermost metallic layer configuring the guard ring (that is, the second metallic wire 40D in FIG. 2).

Further, the bonding pads 13 that are not shown in the drawing are formed around the functional region 11. The aperture 14 is provided at a position each facing the bonding pads 13 on the insulating film 22 or the semiconductor substrate 21, and each of the bonding pads 13 is exposed on the bottom of the aperture 14. Such steps that are described thus far complete the solid-state image pickup device 1 illustrated in FIG. 1 and FIG. 2.

In this solid-state image pickup device 1, an electric charge is generated upon incidence of light into the organic film 11A. A predetermined voltage is applied between the lower transparent electrode 11B and the upper transparent electrode 11C, and a signal charge is collected on the lower transparent electrode 11B by an electric field that is generated by this voltage to be further transferred to a charge output section that is not shown in the drawing, and then is output to the outside of the chip 10 via multi-layer wiring that is not shown in the drawing and the bonding pads 13.

Here, the guard ring 40 is provided in a manner of surrounding the functional region 11 having the organic layer 11A. This guard ring 40 includes the first guard ring 41 that is provided at a region that surrounds the functional region 11 and that does not include the aperture 14. By the use of this first guard ring 41, an intrusion path of moisture and gas from a transverse direction that may reach the functional region 11 via the insulating film 22 and the like from the end surfaces 10A of the chip 10 and the side surfaces of the aperture 14 on the bonding pad 13 is blocked. As a result, any moisture and gas that may intrude from a transverse direction, such as the end surfaces 10A of the chip 10, and the side surfaces of the aperture 14 on the bonding pad 13 are blocked by the guard ring 40 to suppress deterioration in the characteristics of the organic layer 11A.

As described above, in this embodiment of the present disclosure, the functional region 11 having the organic layer 11A is surrounded by the guard ring 40, and thus it is possible to suppress intrusion of moisture and gas from a transverse direction, such as the end surfaces 10A of the chip 10, and the side surfaces of the aperture 14 on the bonding pad 13.

Further, the guard ring 40 is configured in such a manner that one or more metallic layers (metallic plugs 40A and 40C as well as metallic wires 40B and 40D) are laminated around the functional region 11, and thus it is possible to form the guard ring 40 by utilizing existing metallic wiring layers that are originally provided on the solid-state image pickup device 1, and to easily manufacture the solid-state image pickup device 1 according to the above-described embodiment of the present disclosure.

It is to be noted that, in the above-described embodiment of the present disclosure, the description is provided on a case where the two-layer metallic wires 40B and 40D are connected with the semiconductor substrate 21 using the two-layer metallic plugs 40A and 40C as a cross-sectional configuration of the guard ring 40. However, as a matter of course, the number of the metallic layers configuring the guard ring 40 may be changed in accordance with the number of the metallic wiring layers that are provided on the solid-state image pickup device 1. Further, the guard ring 40 does not necessarily have to be configured using all the metallic plugs and metallic wiring layers that are provided on the solid-state image pickup device 1, and it is possible to configure the guard ring 40 using arbitrary wiring layers.

2. Second Embodiment

Figure 3:
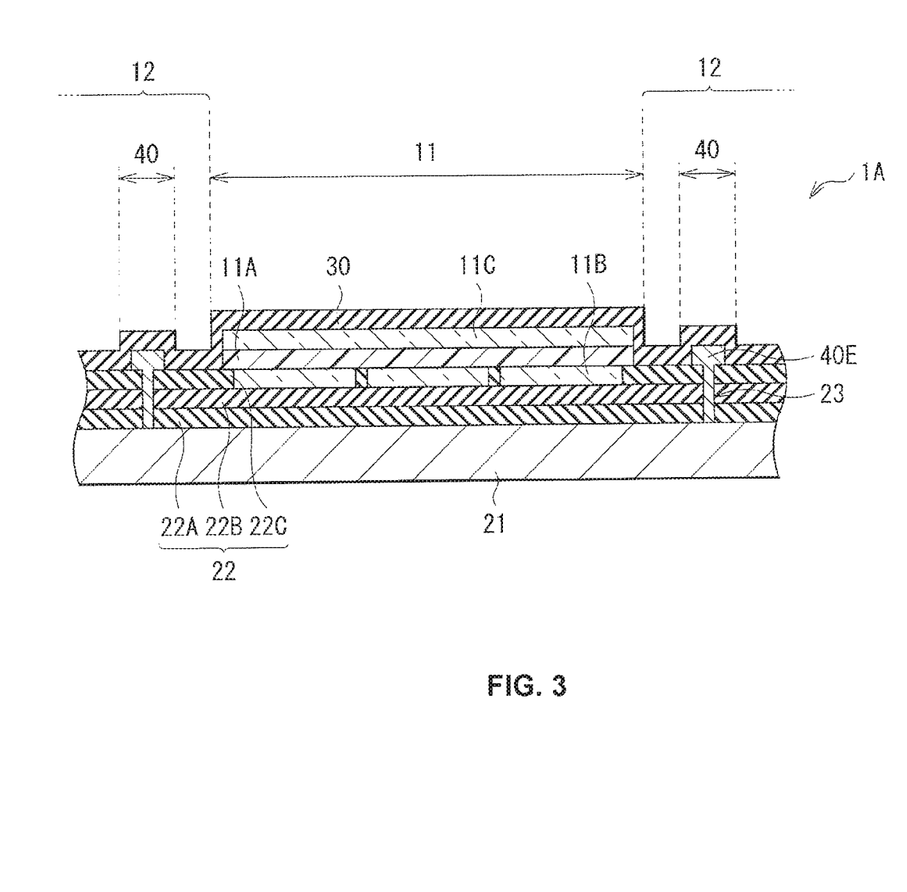
FIG. 3 is a cross-sectional view showing a configuration of a solid-state image pickup device according to a second embodiment of the present disclosure.

FIG. 3 shows a cross-sectional configuration of a solid-state image pickup device according to a second embodiment of the present disclosure. This solid-state image pickup device 1A is different from the solid-state image pickup device 1 according to the first embodiment in the cross-sectional configuration of the guard ring 40. More specifically, the guard ring 40 is configured of an embedded layer 40E that is embedded into the inside of a groove 23 that is provided on the insulating film 22. By providing the embedded layer 40E that is dedicated to the guard ring 40 in such a manner, it is possible to set up a material and thickness of the embedded layer 40E without any restriction. Especially, this may be preferable for a case where a wiring layer is formed of only a transparent electrode layer made of a material such as ITO that does not have a function of suppressing permeation of moisture and gas.

The embedded layer 40E configuring the guard ring 40 may be desirably configured of a metallic film or a silicon nitride film. Further, the metallic film may be desirably configured of, for example, aluminum, tungsten, titanium, molybdenum, tantalum, copper, an alloy film of aluminum, tungsten, titanium, molybdenum, tantalum, copper, or a silicon- or oxygen-containing metallic film of aluminum, tungsten, titanium, molybdenum, tantalum, and copper. Examples of the above-described silicon-containing metallic film may include silicon-containing aluminum (AlSi), tungsten silicide (WSix), and titanium silicide (TiSix). An example of the above-described oxygen-containing metallic film may include an aluminum oxide ($Al_2O_3$) film.

The groove 23 may desirably reach the semiconductor substrate 21. The reason is that this makes it possible to assuredly block off intrusion of moisture and the like.

The passivation film 30 may be desirably cladded directly just above the embedded layer 40E configuring the guard ring 40. This is because when a silicon oxide film such as the insulating film 22 is interposed between the passivation film 30 and the embedded layer 40E, an intrusion path of moisture and the like may be formed through such a silicon oxide film.

It is possible to manufacture this solid-state image pickup device 1A in the following manner, for example.

First, the insulating film 22A and the insulating film 22B each of which is made of the above-described material are formed on the semiconductor substrate 21. At the same time, if desired, a metallic plug or a metallic wire that is not shown in the drawing may be formed.

Subsequently, the lower transparent electrode 11B that is made of the above-described material is formed on the insulating film 22B. Thereafter, the insulating film 22C that is made of the above-described material is formed at a clearance and a surrounding area of the lower transparent electrode 11B.

Thereafter, the organic film 11A and the upper transparent electrode 11C are formed on the lower transparent electrode 11B. In such a manner, the functional region 11 having the lower transparent electrode 11B and the upper transparent electrode 11C with the organic film 11A interposed between is formed.

Following on the formation of the functional region 11, the groove 23 is provided on the insulating film 22 prior to cladding of the passivation film 30, and the embedded layer 40E that is made of the above-described material is embedded into the inside of this groove 23. In such a manner, the guard ring 40 that is configured of the embedded layer 40E that is embedded into the inside of this groove 23 to be provided on the insulating film 22 is formed around the functional region 11.

Afterward, the passivation film 30 that is made of the above-described material is formed over a whole area of the top surface of the functional region 11 and the top surface of the insulating film 22. At this time, the passivation film 30 may be desirably cladded directly just above the embedded layer 40E configuring the guard ring 40.

Further, the bonding pads 13 that are not shown in the drawing are formed around the functional region 11. The aperture 14 is provided at a position each facing the bonding pads 13 on the insulating film 22 or the semiconductor substrate 21, and each of the bonding pads 13 is exposed on the bottom of the aperture 14. Such steps that are described thus far complete the solid-state image pickup device 1A illustrated in FIG. 1 and FIG. 3.

The operation and function of the solid-state image pickup device 1A are the same as those of the solid-state image pickup device 1 according to the first embodiment.

As described above, in this embodiment of the present disclosure, the guard ring 40 is configured of the embedded layer 40E that is embedded into the inside of the groove 23 that is provided on the insulating film 22, and thus it is possible to set up a material and thickness of the embedded layer 40E without any restriction in addition of the effects of the first embodiment. Especially, this may be preferable for a case where a wiring layer is formed of only a transparent electrode layer made of a material such as ITO that does not have a function of suppressing permeation of moisture and gas.

3. Third Embodiment

Figure 4:
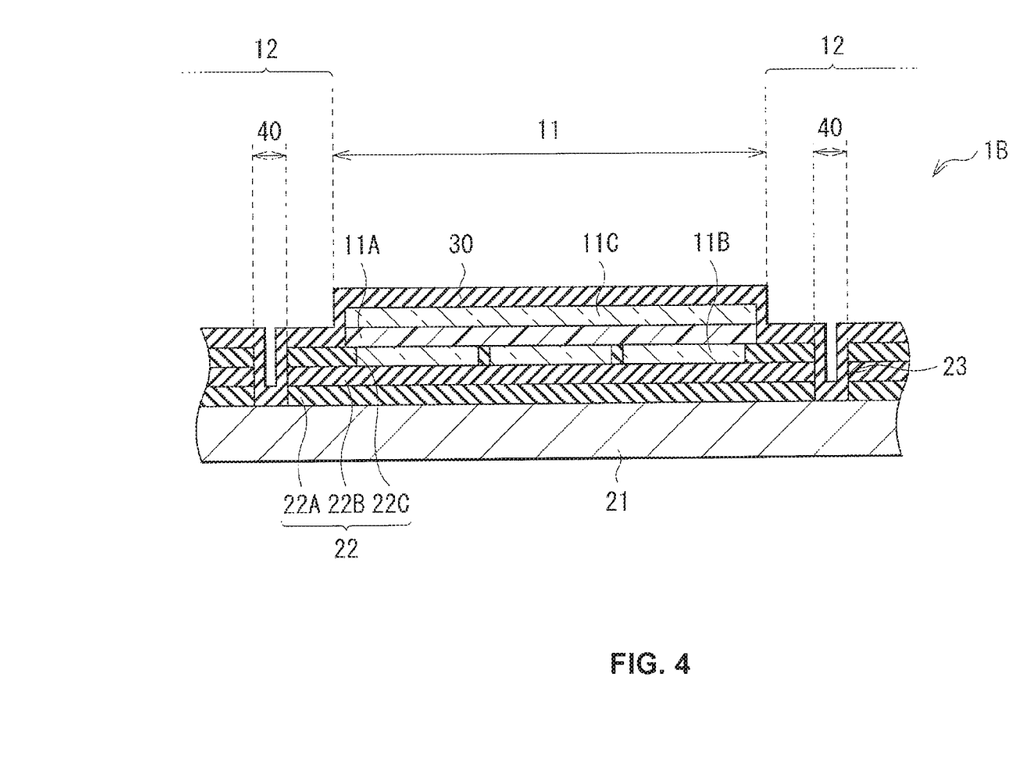
FIG. 4 is a cross-sectional view showing a configuration of a solid-state image pickup device according to a third embodiment of the present disclosure.

FIG. 4 shows a cross-sectional configuration of a solid-state image pickup device according to a third embodiment of the present disclosure. This solid-state image pickup device 1B is different from the solid-state image pickup device 1 according to the first embodiment in the cross-sectional configuration of the guard ring 40. More specifically, the guard ring 40 is configured of the passivation film 30 that is cladded into the inside of the groove 23 that is provided on the insulating film 22. Such a configuration in which the passivation film 30 is also served as the guard ring 40 eliminates the necessity for the use of the metallic films for forming the guard ring 40, and thus it is possible to form the guard ring 40 further more easily.

As with the first embodiment, the passivation film 30 is configured of a material that is not permeable to moisture and oxygen therethrough. More specifically, the passivation film 30 may be desirably configured of a silicon nitride film, a silicon oxynitride film, or an aluminum oxide film. Alternatively, the passivation film 30 may be desirably configured of a laminated film stacking the silicon nitride film, the silicon oxynitride film, or the aluminum oxide film.

The groove 23 may desirably reach the semiconductor substrate 21. The reason is that this makes it possible to assuredly block off intrusion of moisture and the like.

As shown in FIG. 4, the passivation film 30 may be formed along an inner surface of the groove 23. However, the passivation film 30 may desirably embed the groove 23 completely. The reason is that this makes it possible to reduce unevenness or level difference on the top surface of the chip 10, and it is possible to facilitate subsequent manufacturing processes (formation of a planarizing film, as well as formation of a color filter and an on-chip lens).

It is possible to manufacture this solid-state image pickup device 1B in the following manner, for example.

First, the insulating film 22A and the insulating film 22B each of which is made of the above-described material are formed on the semiconductor substrate 21. At the same time, if desired, a metallic plug or a metallic wire that is not shown in the drawing may be formed.

Subsequently, the lower transparent electrode 11B that is made of the above-described material is formed on the insulating film 22B. Thereafter, the insulating film 22C that is made of the above-described material is formed at a clearance and a surrounding area of the lower transparent electrode 11B.

Thereafter, the organic film 11A and the upper transparent electrode 11C are formed on the lower transparent electrode 11B. In such a manner, the functional region 11 having the lower transparent electrode 11B and the upper transparent electrode 11C with the organic film 11A interposed between is formed.

Following on the formation of the functional region 11, the groove 23 is provided on the insulating film 22 prior to cladding of the passivation film 30. Afterward, the passivation film 30 that is made of the above-described material is formed over a whole area of the top surface of the functional region 11 and the top surface of the insulating film 22, and the passivation film 30 is embedded into the inside of the groove 23. In such a manner, the guard ring 40 that is configured of the passivation film 30 that is embedded into the inside of the groove 23 to be provided on the insulating film 22 is formed around the functional region 11.

Further, the bonding pads 13 that are not shown in the drawing are formed around the functional region 11. The aperture 14 is provided at a position each facing the bonding pads 13 on the insulating film 22 or the semiconductor substrate 21, and each of the bonding pads 13 is exposed on the bottom of the aperture 14. Such steps that are described thus far complete the solid-state image pickup device 1B illustrated in FIG. 1 and FIG. 4.

The operation and function of the solid-state image pickup device 1B are the same as those of the solid-state image pickup device 1 according to the first embodiment.

As described above, in this embodiment of the present disclosure, the guard ring 40 is configured of the passivation film 30 that is embedded into the inside of the groove 23 that is provided on the insulating film 22, and thus it is possible to form the guard ring 40 further more easily in addition to the effects of the first embodiment.

4. Fourth Embodiment

Figure 5:
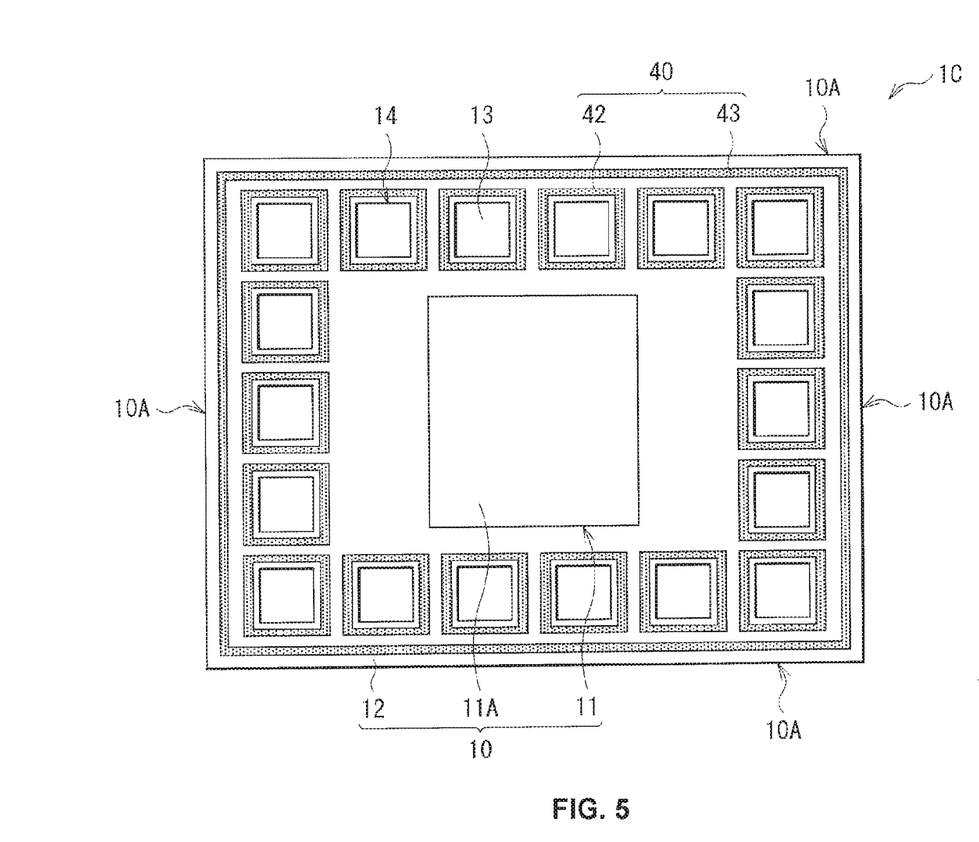
FIG. 5 is a cross-sectional view showing a configuration of a solid-state image pickup device according to a fourth embodiment of the present disclosure.

FIG. 5 shows a planar configuration of a solid-state image pickup device according to a fourth embodiment of the present disclosure. This solid-state image pickup device 1C is different from the solid-state image pickup device 1 according to the first embodiment in a planar shape of the guard ring 40. More specifically, the guard ring 40 includes second guard rings 42 each of which surrounds the aperture 14 and a third guard ring 43 along the outer circumference of the chip 10. In concrete terms, the second guard ring 42 is provided along a visible outline of the aperture 14, and one second guard ring 42 surrounds one aperture 14. The third guard ring 43 surrounds a whole area of the functional region 11 and the apertures 14 along a visible outline of the chip 10. As a result, in this embodiment of the present disclosure, the guard ring 40 is arranged at a location away from the functional region 11, and thus it is possible to arrange a peripheral circuit section around the functional region 11 without any restriction of a layout, as well as to achieve the optimum layout of peripheral circuits that suppresses delay in signal transmission and the like.

For a cross-sectional configuration of the guard ring 40, it is possible to adopt any of the above-described first, second, or third embodiments of the present disclosure.

It is possible to manufacture this solid-state image pickup device 1C in the same manner as with the above-described first, second, or third embodiments in accordance with a cross-sectional configuration of the guard ring 40. In this embodiment of the present disclosure, the guard ring 40 is arranged at a location away from the functional region 11, and thus when a material film to be served as a color filter or an on-chip lens is formed on the functional region 11 in a spin coating method in the manufacturing method, it is less likely that film unevenness and the like will be caused due to a level difference of the guard ring 40. Therefore, this makes it possible to suppress unevenness in a shape of a color filter or an on-chip lens in ends of the functional region 11.

In this solid-state image pickup device 1C, an electric charge is generated upon incidence of light into the organic film 11A. As with the first embodiment, such a charge is collected on the lower transparent electrode 11B to be further transferred to a charge output section that is not shown in the drawing, and then is output to the outside of the chip 10 via multi-layer wiring that is not shown in the drawing and the bonding pads 13.

Here, the guard ring 40 includes the second guard rings 42 each of which surrounds the aperture 14 and the third guard ring 43 along the outer circumference of the chip 10. Therefore, as with the first embodiment, any moisture and gas that may intrude from a transverse direction, such as the end surfaces 10A of the chip 10, and the side surfaces of the aperture 14 on the bonding pad 13 are blocked by the second guard rings 42 and the third guard ring 43 to suppress deterioration in the characteristics of the organic layer 11A.

As described above, in this embodiment of the present disclosure, the guard ring 40 includes the second guard rings 42 each of which surrounds the aperture 14 and the third guard ring 43 along the outer circumference of the chip 10, and thus it is possible to achieve the optimum layout of peripheral circuits that suppresses delay in signal transmission and the like in addition to the effects of the first embodiment.

5. Fifth Embodiment

Figure 6:
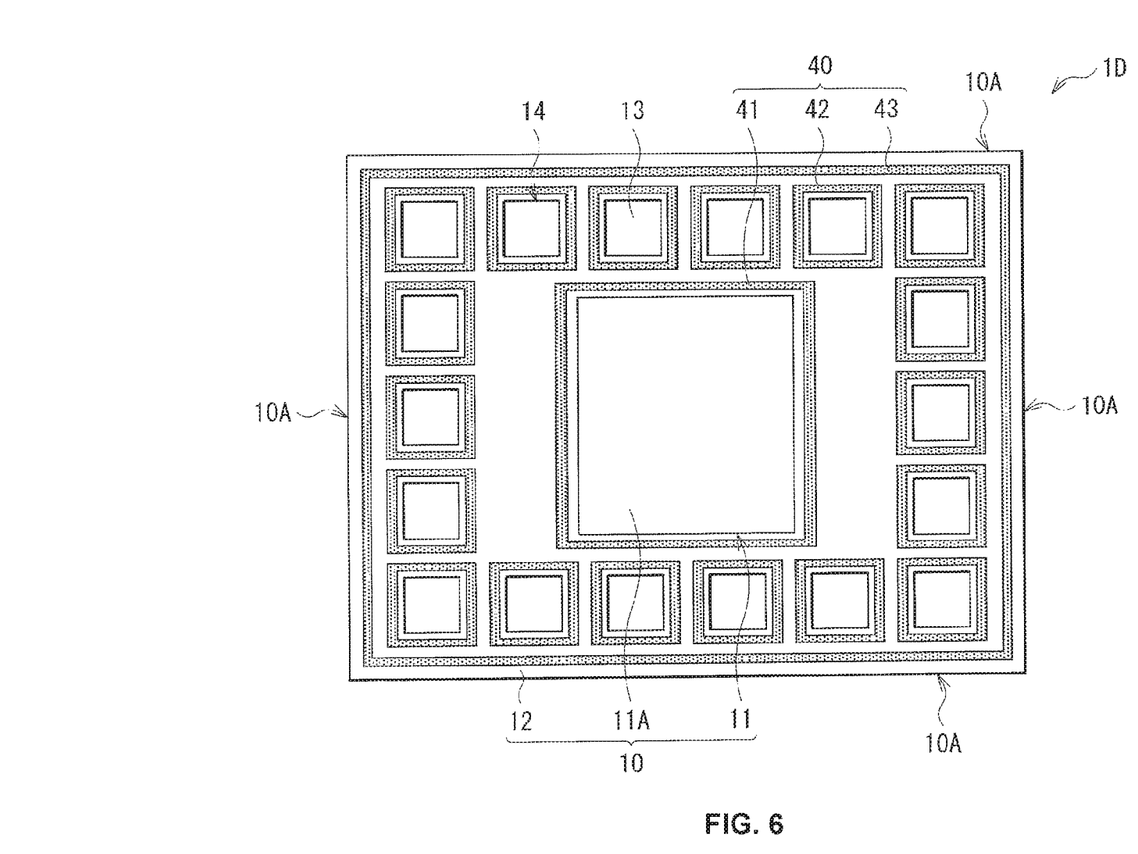
FIG. 6 is a cross-sectional view showing a configuration of a solid-state image pickup device according to a fifth embodiment of the present disclosure.

FIG. 6 shows a planar configuration of a solid-state image pickup device according to a fifth embodiment of the present disclosure. This solid-state image pickup device 1D combines the first and fourth embodiments concerning a planar shape of the guard ring 40. More specifically, the guard ring 40 includes the first guard ring 41 that is provided at a region that surrounds the functional region 11 and that does not include the aperture 14, the second guard rings 42 each of which surrounds the aperture 14, and the third guard ring 43 along the outer circumference of the chip 10. As a result, in this embodiment of the present disclosure, an intrusion path of moisture and gas that may reach the functional region 11 from the end surfaces 10A of the chip 10, the side surfaces of the aperture 14 on the bonding pad 13, and the like is blocked in two stages by the second guard rings 42 and the third guard ring 43, as well as the first guard ring 41, and thus it is possible to further improve the reliability of the solid-state image pickup device 1D.

For a cross-sectional configuration of the guard ring 40, it is possible to adopt any of the above-described first, second, or third embodiments of the present disclosure.

It is possible to manufacture this solid-state image pickup device 1D in the same manner as with the above-described first, second, or third embodiments in accordance with a cross-sectional configuration of the guard ring 40.

In this solid-state image pickup device 1D, an electric charge is generated upon incidence of light into the organic film 11A. As with the first embodiment, such a charge is collected on the lower transparent electrode 11B to be further transferred to a charge output section that is not shown in the drawing, and then is output to the outside of the chip 10 via multi-layer wiring that is not shown in the drawing and the bonding pads 13.

Here, the guard ring 40 includes the first guard ring 41 that is provided at a region that surrounds the functional region 11 and that does not include the aperture 14, the second guard rings 42 each of which surrounds the aperture 14, and the third guard ring 43 along the outer circumference of the chip 10. Therefore, any moisture and gas that may intrude in a transverse direction from the end surfaces 10A of the chip 10 are blocked in two stages by the third guard ring 43 and the first guard ring 41. Further, any moisture and gas that may intrude in a transverse direction from the side surfaces of the aperture 14 on the bonding pad 13 are blocked in two stages by the second guard ring 42 and the first guard ring 41. Consequently, this ensures to suppress deterioration in the characteristics of the organic layer 11A.

As described above, in this embodiment of the present disclosure, the guard ring 40 includes the first guard ring 41 that is provided at a region that surrounds the functional region 11 and that does not include the aperture 14, the second guard rings 42 each of which surrounds the aperture 14, and the third guard ring 43 along the outer circumference of the chip 10, and thus it is possible to further more assuredly suppress intrusion of moisture and gas from a transverse direction, such as the end surfaces 10A of the chip 10, and the side surfaces of the aperture 14 on the bonding pad 13 in addition to the effects of the first embodiment.

6. Sixth Embodiment

Figure 7:
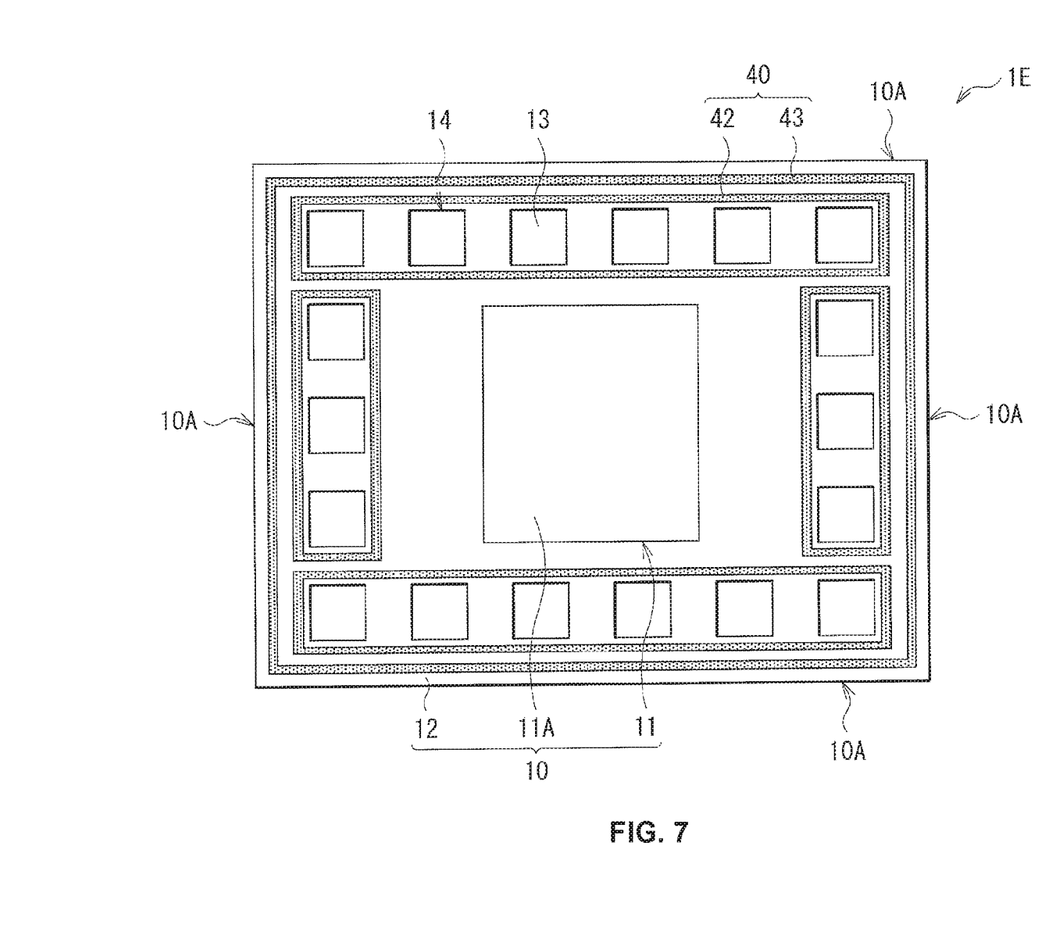
FIG. 7 is a cross-sectional view showing a configuration of a solid-state image pickup device according to a sixth embodiment of the present disclosure.

FIG. 7 shows a planar configuration of a solid-state image pickup device according to a sixth embodiment of the present disclosure. This solid-state image pickup device 1E is different from the solid-state image pickup device 1 according to the first embodiment in a planar shape of the guard ring 40. More specifically, as with the fourth embodiment, the guard ring 40 includes the second guard rings 42 each of which surrounds the aperture 14 and the third guard ring 43 along the outer circumference of the chip 10. The second guard ring 42 is provided across the plurality of apertures 14. In this embodiment of the present disclosure, this reduces a concern about a possibility that the guard ring 40 will interfere with reduction in a distance between the bonding pads 13 (pad pitch). Therefore, it is possible to make the pad pitch smaller for reducing a size of the overall chip 10, and this is favorable for reduction in size and costs.

For a cross-sectional configuration of the guard ring 40, it is possible to adopt any of the above-described first, second, or third embodiments of the present disclosure.

It is possible to manufacture this solid-state image pickup device 1E in the same manner as with the above-described first, second, or third embodiments in accordance with a cross-sectional configuration of the guard ring 40.

The operation, function, and effects of this solid-state image pickup device 1E are the same as those of the solid-state image pickup device 1C according to the fourth embodiment.

It is to be noted that, in this embodiment of the present disclosure, as a matter of course, the guard ring 40 may also include the first guard ring 41 that is provided at a region that surrounds the functional region 11 and that does not include the aperture 14.

7. Seventh Embodiment

Figure 8:
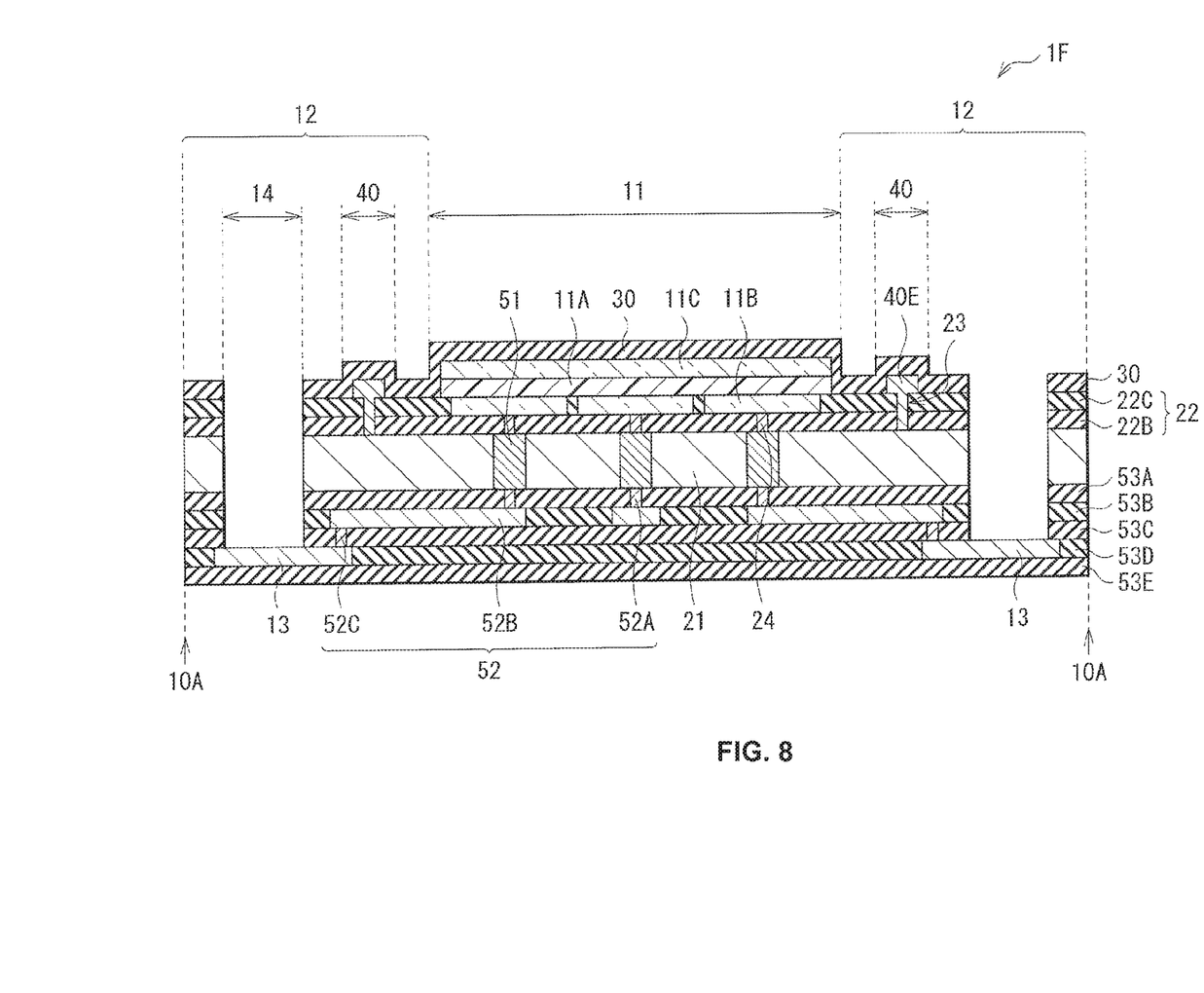
FIG. 8 is a cross-sectional view showing a configuration of a solid-state image pickup device according to a seventh embodiment of the present disclosure.

FIG. 8 shows a cross-sectional configuration of a solid-state image pickup device according to a seventh embodiment of the present disclosure. This embodiment relates to an example of a connecting configuration between the lower transparent electrode 11B and the bonding pads 13 in a case where the guard ring 40 is provided, and is applicable to all of the above-described first to sixth embodiments. It is to be noted that FIG. 8 shows a case where the guard ring 40 has the planar shape similar to that in the first embodiment (see FIG. 1) and the cross-sectional shape similar to that in the second embodiment (see FIG. 3). However, the planar shape of the guard ring 40 may be also similar to that in any of the fourth to sixth embodiments, and the cross-sectional shape of the guard ring 40 may be also similar to that in the first or third embodiment.

More specifically, this solid-state image pickup device 1F has a charge transmission section (charge transfer section) 51 inside the semiconductor substrate 21, and a multi-layer wiring 52 on the opposite side of the semiconductor substrate 21. The charge transmission section 50 is provided in a manner of passing through from the principal surface to the opposite surface of the semiconductor substrate 21, and transmits a signal charge that is photoelectric-converted by the organic film 11A or a potential corresponding to a signal charge to the bonding pads 13 via the multi-layer wiring 52.

In concrete terms, an end on the principal surface side of the charge transmission section 51 is connected with the lower transparent electrode 11B via the metallic plug 24. An end on the opposite side of the charge transmission section 51 is connected with the bonding pad 13 via the multi-layer wiring 52. The multi-layer wiring 52 may include, for example, a first metallic plug 52A, a metallic wire 52B, and a second metallic plug 52C in this order from the charge transmission section 51 side. The multi-layer wiring 52 and the bonding pad 13 are insulated by insulating films 53A to 53E each of which may be configured of, for example, a silicon oxide film. It is to be noted that FIG. 8 illustrates the charge transmission section 51 in an abstracted form, and a configuration of the charge transmission section 51 is not specifically limited. Further, the number of stacked layers and configuration of the metallic plug 24 and the multi-layer wiring 52 are also not specifically limited.

In this solid-state image pickup device 1F, a signal charge that is photoelectric-converted by the organic film 11A is collected on the lower transparent electrode 11B, and thereafter is further transferred to the bonding pads 13 via the first metallic plug 52A, the metallic wire 52B, and the second metallic plug 52C that are provided on the opposite side of a light incidence surface of the semiconductor substrate 21 by the charge transmission section 51 that is provided inside the semiconductor substrate 21 to be output to the outside.

It is to be noted that, in this embodiment of the present disclosure, a configuration is shown where a signal that is photoelectric-converted by the organic film 11A is transmitted directly to the bonding pads 13. However, it is possible to adopt various signal output methods that are introduced typically in an image sensor, such as a method of converting a charge into a voltage in the course until a point of time when a signal is taken out of the bonding pads 13.

Further, FIG. 8 shows a case where the bonding pads 13 are provided on the opposite side of the principal surface (light incidence surface) of the semiconductor substrate 21. However, the bonding pads 13 may be formed on the principal surface side of the semiconductor substrate 21. In this case, it is also possible to adopt a configuration in which a signal charge or a signal voltage is once transmitted to the metallic wire arranged on the opposite side of the semiconductor substrate 21, and subsequently such a signal charge or a signal voltage is connected with the bonding pads 13 that are formed on the principal surface of the semiconductor substrate 21 by the use of the charge transmission section or the charge transfer section that is provided below the bonding pads 13 in a manner of passing through the semiconductor substrate 21.

The present disclosure is described thus far with reference to some embodiments. However, the present disclosure is not limited to the above-described embodiments, and various modifications may be made.

Figure 9:
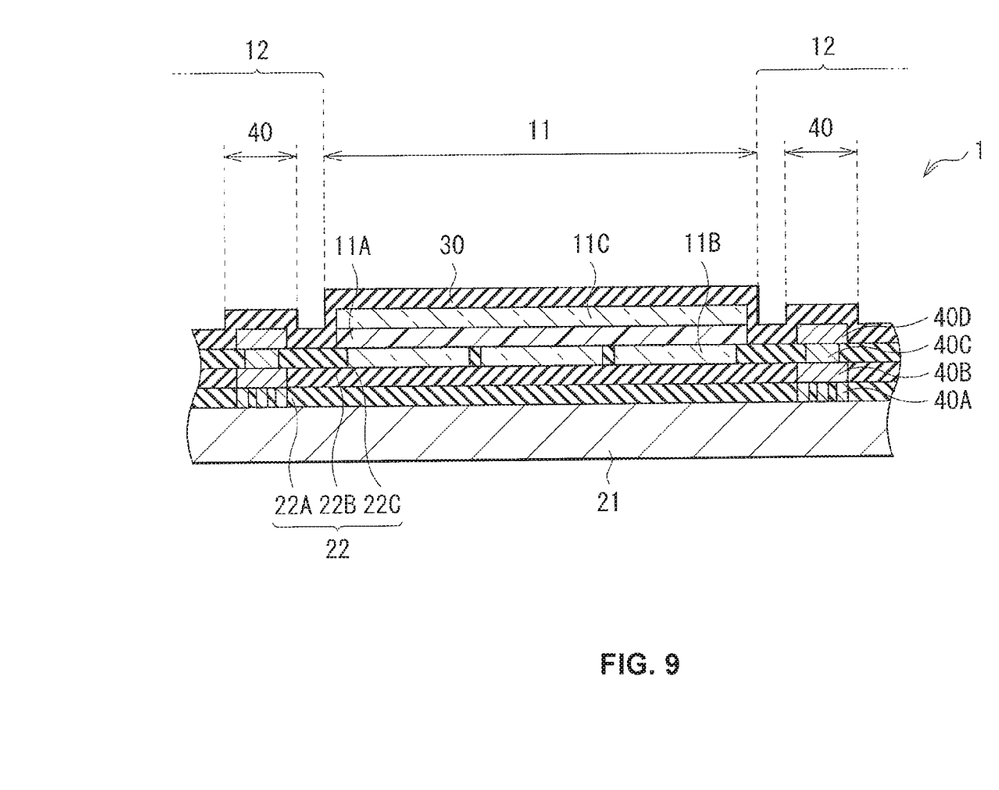
FIG. 9 is a cross-sectional view showing a modification example of the solid-state image pickup device illustrated in FIG. 2.

For example, in the above-described first embodiment, the description is provided on a case where the single first metallic plug 40A is provided between the semiconductor substrate 21 and the first metallic wire 40B. However, as shown in FIG. 9, the two first metallic plugs 40A may be provided alternatively. The same is true for other metallic plugs.

Figure 10:
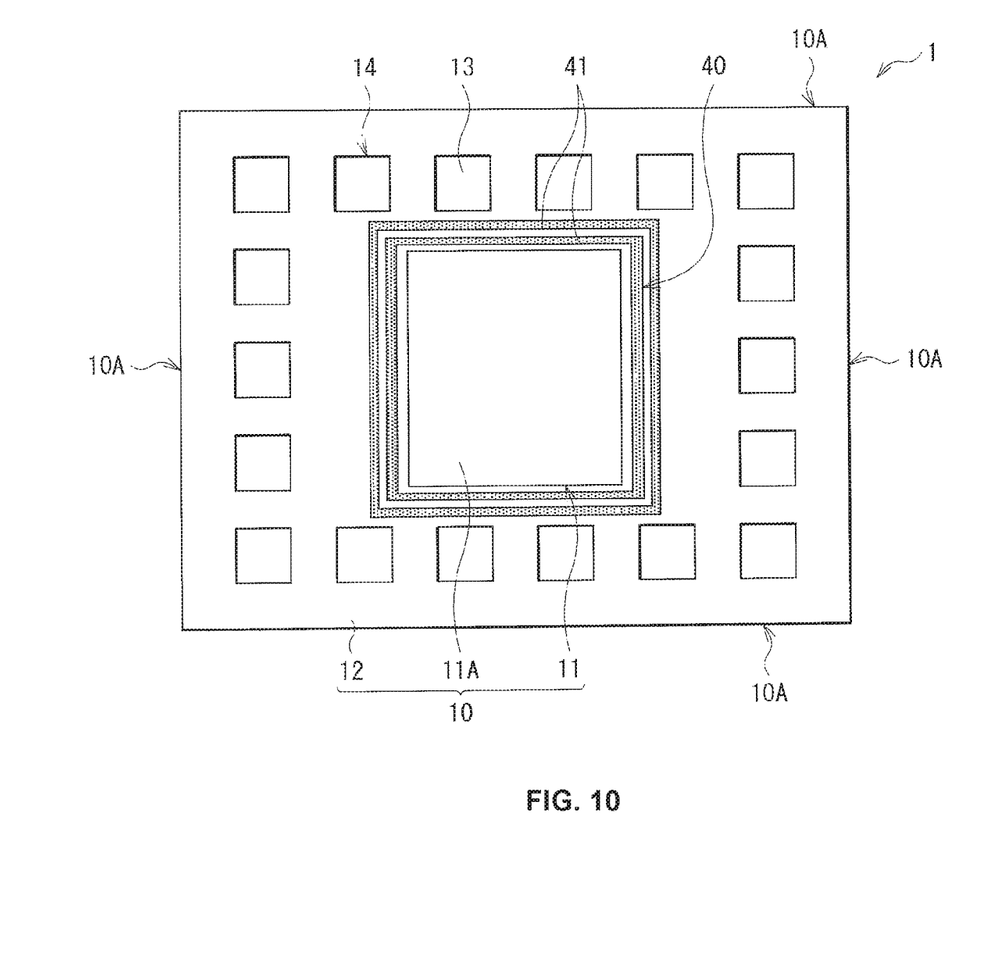
FIG. 10 is a schematic plan view showing another modification example of the solid-state image pickup device illustrated in FIG. 1.

Further, in the above-described embodiments, the description is provided on a case where each of the first guard ring 41, the second guard ring 42, and the third guard ring 43 is provided singly. However, for example, as shown in FIG. 10, it is also possible to provide the twofold first guard ring 41. The same is true for the second guard ring 42 and the third guard ring 43.

Moreover, for example, in the above-described embodiments, the description is provided on a case where the lower transparent electrode 11B is split for each pixel, and the upper transparent electrode 11C is a common electrode. However, it is also possible to adopt a configuration in which the upper transparent electrode 11C is split for each pixel, and the lower transparent electrode 11B is a common electrode. In this case, a photoelectric-converted signal charge is collected on the upper transparent electrode 11C to be output to the outside of the chip 10 via a charge output section (not shown in the drawing) that is connected with the upper transparent electrode 11C.

In addition, for example, in the above-described embodiments, the configurations of the solid-state image pickup devices 1A to 1F are explained with concrete descriptions. However, it is not necessary to provide all the component parts, and any other component parts may be further provided.

It is possible to achieve at least the following configurations from the above-described example embodiments of the disclosure.

(1)

A solid-state image pickup device, including:
a functional region provided with an organic film; and
a guard ring surrounding the functional region.

(2)

The solid-state image pickup device according to (1), further including:
a bonding pad that is provided at a peripheral region around the functional region; and
an aperture that is provided at a position facing the bonding pad.

(3)

The solid-state image pickup device according to (2), wherein the guard ring includes a first guard ring that is provided at a region that surrounds the functional region and that does not include the aperture.

(4)

The solid-state image pickup device according to (2) or (3), wherein the guard ring includes:

a second guard ring surrounding the aperture; and a third guard ring along an outer circumference of a chip.

(5)

The solid-state image pickup device according to (4), wherein the second guard ring is provided across a plurality of apertures.

(6)

The solid-state image pickup device according to any one of (1) to (5), wherein the guard ring is configured of a material film that is not permeable to moisture and oxygen therethrough.

(7)

The solid-state image pickup device according to any one of (1) to (6), wherein the guard ring has a configuration in which one or more metallic layers are laminated around the functional region.

(8)

The solid-state image pickup device according to (7), wherein the metallic layer is configured of aluminum, tungsten, titanium, molybdenum, tantalum, copper, an alloy film of aluminum, tungsten, titanium, molybdenum, tantalum, copper, or a silicon- or oxygen-containing metallic film of aluminum, tungsten, titanium, molybdenum, tantalum, and copper.

(9)

The solid-state image pickup device according to (7) or (8), further including a passivation film;

the passivation film is cladded directly on an uppermost layer configuring the guard ring.

(10)

The solid-state image pickup device according to any one of (1) to (6), further including an insulating film around the functional region; wherein the guard ring is configured of an embedded layer that is embedded into an inside of a groove that is provided on the insulating film.

(11)

The solid-state image pickup device according to (10), wherein the embedded layer is configured of a metallic film or a silicon nitride film.

(12)

The solid-state image pickup device according to (11), wherein the metallic layer is configured of aluminum, tungsten, titanium, molybdenum, tantalum, copper, an alloy film of aluminum, tungsten, titanium, molybdenum, tantalum, copper, or a silicon- or oxygen-containing metallic film of aluminum, tungsten, titanium, molybdenum, tantalum, and copper.

(13)

The solid-state image pickup device according to any one of (10) to (12), further including a passivation film that covers a top surface of the functional region and a top surface of the insulating film, wherein the passivation film is cladded directly on the embedded layer.

(14)

The solid-state image pickup device according to any one of (1) to (6), further including:

an insulating film that is provided around the functional region; and a passivation film that covers a top surface of the functional region and a top surface of the insulating film, wherein the guard ring is configured of the passivation film cladded at an inside of a groove that is provided on the insulating film.

(15)

The solid-state image pickup device according to any one of (9), (13) and (14) wherein the passivation film is configured of a material film that is not permeable to moisture and oxygen therethrough.

(16)

The solid-state image pickup device according to (15), wherein the passivation film is configured of a silicon nitride film, a silicon oxynitride film, or an aluminum oxide film, or a laminated film stacking a silicon nitride film, a silicon oxynitride film, or an aluminum oxide film.

(17)

The solid-state image pickup device according to any one of (1) to (16), further including:

a semiconductor substrate on which the functional region is provided on a principal surface side thereof;

a charge transmission section that is provided inside the semiconductor substrate; and a multi-layer wire that is provided on an opposite side of the principal surface of the semiconductor substrate and is connected with the bonding pad, wherein the charge transmission section transmits a signal charge that is photoelectric-converted by the organic film or a potential corresponding to a signal charge to the bonding pad via the multi-layer wire.

(18)

A method of manufacturing a solid-state image pickup device, the method including:

forming a functional region provided with an organic film on a principal surface side of a semiconductor substrate; and forming a guard ring surrounding the functional region by laminating one or more metallic layers around the functional region.

(19)

A method of manufacturing a solid-state image pickup device, the method including:

forming a functional region provided with an organic film on a principal surface side of a semiconductor substrate, and forming an insulating film around the functional region; and forming a guard ring surrounding the functional region by providing a groove on the insulating film to form an embedded layer that is configured of a metallic film or a silicon nitride film inside the groove.

(20)

A method of manufacturing a solid-state image pickup device, the method including:

forming a functional region provided with an organic film on a principal surface side of a semiconductor substrate, and forming an insulating film around the functional region; and forming a guard ring surrounding the functional region by providing a groove on the insulating film to clad a passivation film inside the groove.

This application claims the priority on the basis of Japanese Patent Application No. 2011-271195 filed on Dec. 12, 2011 in Japan Patent Office, the entire contents of which are incorporated in this application by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. An image pick-up device comprising:
a substrate;
a functional region on the substrate;
an organic photoelectric conversion film between two electrodes in the functional region;
a peripheral region on the substrate and surrounding the functional region;
one or more insulating layers between the organic photoelectric conversion film and the substrate;
a bonding pad in the peripheral region;
an aperture in the one or more insulating layers exposing the bonding pad; and
a guard ring that, in plan view, surrounds either the bonding pad or the functional region.

2. The image pickup device of claim 1, wherein:
the functional region includes two or more image pick-up regions, and
the organic photoelectric conversion film extends continuously over all of the image pick-up regions.

3. The image pick-up device of claim 1, wherein the organic photoelectric conversion film includes a pigment selected from the group consisting of a rhodamine-based pigment, a melacyanine-based pigment, aquinacridone, a phthalocyanine-based pigment, a coumarine-based pigment, and a tris-8-hydroxyquinoline aluminum (Alq3), melacyanine-based pigment.

4. The image pickup device of claim 1, wherein the organic photoelectric conversion film includes a pigment selected from the group consisting of a rhodamine-based pigment, a melacyanine-based pigment, aquinacridone, a phthalocyanine-based pigment, a coumarine-based pigment, and a tris-8-hydroxyquinoline aluminum (Alq3), melacyanine-based pigment.

5. The image pickup device according to claim 1, wherein the guard ring includes a first guard ring that is within a region that surrounds the functional region and that does not include the aperture.

6. The image pickup device according to claim 5, wherein the guard ring includes:
a second guard ring surrounding the aperture; and
a third guard ring along an outer circumference of a chip.

7. The image pickup device according to claim 6, wherein the second guard ring extends across a plurality of apertures.

8. The image pickup device according to claim 1, wherein the guard ring is formed from a material that is not permeable to moisture and oxygen.

9. The image pickup device according to claim 1, wherein the guard ring has a configuration in which one or more metallic layers are laminated around the functional region.

10. The image pickup device according to claim 9, wherein each metallic layer is configured of a material selected from the group consisting of aluminum, tungsten, titanium, molybdenum, tantalum, copper, an alloy film of aluminum, tungsten, titanium, molybdenum, tantalum, copper, or a silicon- or oxygen-containing metallic film of aluminum, tungsten, titanium, molybdenum, tantalum, and copper.

11. The image pickup device according to claim 9, further comprising a passivation film, the passivation film being cladded directly on an uppermost layer configuring the guard ring.

12. The image pickup device according to claim 1, further comprising:
an insulating film at least around the functional region; and
a groove in the insulating layer,
wherein,
the guard ring is embedded in the groove.

13. The image pickup device according to claim 12, wherein the embedded guard ring is configured of a metallic film or a silicon nitride film.

14. The image pickup device according to claim 13, wherein the embedded guard ring is configured of a material selected from the group consisting of aluminum, tungsten, titanium, molybdenum, tantalum, copper, an alloy film of aluminum, tungsten, titanium, molybdenum, tantalum, copper, or a silicon- or oxygen-containing metallic film of aluminum, tungsten, titanium, molybdenum, tantalum, and copper.

15. The image pickup device according to claim 12, further comprising a passivation film that covers a top surface of the functional region and a top surface of the insulating film, the passivation film being cladded directly on the embedded guard ring.

16. The image pickup device according to claim 1, further comprising:
an insulating film extending around the functional region; and
a passivation film covering a top surface of the functional region and a top surface of the insulating film,
wherein,
the guard ring is configured of the passivation film cladded at an inside of a groove that is provided in the insulating film.

17. The image pickup device according to claim 11, wherein the passivation film is configured of a material film that is not permeable to moisture and oxygen therethrough.

18. The image pickup device according to claim 17, wherein the passivation film is configured of a silicon nitride film, a silicon oxynitride film, or an aluminum oxide film, or a laminated film stacking a silicon nitride film, a silicon oxynitride film, or an aluminum oxide film.

19. The image pickup device according to claim 1, further comprising:
a charge transmission section inside the substrate; and
a multi-layer wire on an opposite side of a principal surface of the semiconductor substrate and connected with the bonding pad,
wherein,
in operation, the charge transmission section transmits a signal charge that is photoelectrically converted by the organic photoelectric conversion film or a potential corresponding to a signal charge to the bonding pad via the multi-layer wire.

* * * * *